(12) United States Patent
Yang et al.

(10) Patent No.: US 11,374,419 B2
(45) Date of Patent: Jun. 28, 2022

(54) PORTABLE ELECTRICAL ENERGY SYSTEM AND METHOD FOR MEASURING A REMAINING ELECTRIC QUANTITY OF A BATTERY PACK

(71) Applicant: Nanjing Chervon Industry Co., Ltd., Nanjing (CN)

(72) Inventors: Dezhong Yang, Nanjing (CN); Jingru Zhang, Nanjing (CN); Hong Zhu, Nanjing (CN); Qing Gao, Nanjing (CN)

(73) Assignee: Nanjing Chervon Industry Co., Ltd., Nanjing (CN)

( * ) Notice: Subject to any disclaimer, the term of this patent is extended or adjusted under 35 U.S.C. 154(b) by 0 days.

(21) Appl. No.: 16/896,781

(22) Filed: Jun. 9, 2020

(65) Prior Publication Data

US 2020/0358303 A1 Nov. 12, 2020

Related U.S. Application Data

(63) Continuation of application No. PCT/CN2018/119374, filed on Dec. 5, 2018.

(30) Foreign Application Priority Data

Dec. 8, 2017 (CN) .......................... 201711295047.5
Dec. 8, 2017 (CN) .......................... 201711298087.5

(51) Int. Cl.
*H02J 7/00* (2006.01)
*G01R 31/389* (2019.01)
(Continued)

(52) U.S. Cl.
CPC .......... *H02J 7/0048* (2020.01); *G01R 31/367* (2019.01); *G01R 31/389* (2019.01);
(Continued)

(58) Field of Classification Search
CPC .... H02J 7/0048; H02J 7/0013; G01R 31/389; G01R 31/396; G01R 31/3842; G01R 31/367

See application file for complete search history.

(56) References Cited

U.S. PATENT DOCUMENTS 7,038,424 B2 * 5/2006 Adams .............. H01M 8/04589
320/101
7,675,263 B2 * 3/2010 Kawasumi ............ H02J 7/0031
320/112
(Continued)

FOREIGN PATENT DOCUMENTS

CN 101359036 A 2/2009
CN 101369741 A 2/2009
(Continued)

OTHER PUBLICATIONS

ISA/CN, International Search Report issued on PCT application No. CN2018/119374, dated Mar. 12, 2019, 3 pages.

*Primary Examiner* — Bryan Bui
(74) *Attorney, Agent, or Firm* — Greenberg Traurig, LLP

(57) ABSTRACT

A measuring method for a portable electrical energy system includes acquiring a total capacity and an initial electric quantity percentage of each battery pack, detecting a discharging current and a discharging time of each battery pack, calculating a discharging capacity of each battery pack, calculating a remaining electric quantity of each battery pack; calculating a real-time electric quantity percentage of each battery pack; acquiring an open circuit voltage of each battery pack and a real-time internal resistance of a cell unit of each battery pack; calculating a remaining electric quantity of each battery pack; and calculating a remaining electric quantity of the portable electrical energy system.

(Continued)

This method can reduce the calculation error of the remaining electric quantity and improve the battery utilization.

12 Claims, 14 Drawing Sheets

(51) Int. Cl.
  *G01R 31/396* (2019.01)
  *G01R 31/3842* (2019.01)
  *G01R 31/367* (2019.01)

(52) U.S. Cl.
  CPC ....... *G01R 31/3842* (2019.01); *G01R 31/396* (2019.01); *H02J 7/0013* (2013.01)

(56) References Cited

U.S. PATENT DOCUMENTS

2007/0188148 A1* 8/2007 Kawasumi .......... H01M 50/572
  320/134
2020/0304032 A1* 9/2020 Zhu ....................... H02J 7/0063

FOREIGN PATENT DOCUMENTS

| | | |
|---|---|---|
| CN | 101922464 A | 12/2010 |
| CN | 102147450 A | 8/2011 |
| CN | 103280854 A | 9/2013 |
| CN | 105070975 A | 11/2015 |
| CN | 105359295 A | 2/2016 |
| CN | 106130112 A | 11/2016 |
| CN | 106712202 A | 5/2017 |
| WO | 2016/054732 A1 | 4/2016 |

* cited by examiner

PORTABLE ELECTRICAL ENERGY SYSTEM AND METHOD FOR MEASURING A REMAINING ELECTRIC QUANTITY OF A BATTERY PACK

RELATED APPLICATION INFORMATION

This application claims the benefit of and is a continuation of International Application Number PCT/CN2018/119374, filed on Dec. 5, 2018, which application claims the benefit of Chinese Patent Application No. 201711295047.5, filed on Dec. 8, 2017, and Chinese Patent application number 201711298087.5, filed on Dec. 8, 2017, the disclosure of which are incorporated herein in their entirety by reference.

TECHNICAL FIELD

The present disclosure relates to a portable electrical energy system, in particular to a portable electrical energy system capable of outputting alternating current and a method for measuring remaining electric quantity.

BACKGROUND

With the development of battery technologies, power tools are gradually replacing engine tools. In order to achieve the working effect and battery life similar to those of the engine, the rated power and capacity of the battery pack are also increasing.

An alternating current power supply is usually needed to power some electric tools or facilities during working and traveling outdoors; traditional portable power supplies are often powered by battery cell units inside the portable power supplies, and the alternating current cannot be provided continuously once the battery packs of the power supply run out of electrical energy.

SUMMARY

To achieve the object, the present disclosure adopts the technical solutions described below.

In a described example, a measuring method for a portable electrical energy system, where the portable power system includes a power supply device and a plurality of battery packs detachably connected to the power supply device, includes steps of: acquiring a total capacity and an initial electric quantity percentage of each battery pack; detecting a discharging current and a discharging time of each of the plurality of battery packs; calculating a discharging capacity of each of the plurality of battery packs, where the discharging capacity of each of the plurality of battery packs is equal to an integral of the discharging current and the discharging time of each of the plurality of battery packs; calculating currently an initial remaining electric quantity of each of the plurality of battery packs, where the initial remaining electric quantity of each of the plurality of battery packs is equal to a product of the total capacity of each of the plurality of battery packs and the initial electric quantity percentage minus the discharging capacity; calculating currently a real-time electric quantity percentage of each of the plurality of battery packs, where the real-time electric quantity percentage is equal to a remaining electric quantity of each of the plurality of battery packs divided by the total capacity of each of the plurality of battery packs; acquiring an open circuit voltage of each of the plurality of battery packs and a real-time internal resistance of a cell unit of each of the plurality of battery packs; calculating currently a remaining electric quantity of each of the plurality of battery packs, where the remaining electric quantity is equal to a ratio of a difference between the open circuit voltage and a discharge cut-off voltage of each of the plurality of battery packs to the real-time internal resistance of the cell unit; and calculating a remaining electric quantity of the portable electrical energy system, where the remaining electric quantity of the portable electrical energy system is equal to a sum of remaining electric quantities of battery packs accessed to the power supply device.

In a described example, the open circuit voltage of each of the plurality of battery packs is calculated according to an electric quantity percentage curve of each of the plurality of battery packs.

In a described example, the real-time internal resistance of the cell unit is calculated according to a cell internal resistance table of each of the plurality of battery packs.

In a described example, the measuring method further includes steps of: reading identity (ID) information of the each accessed battery pack; determining whether the ID information of each of the plurality of battery packs is stored in the power supply device; and in response to determining that the ID information of each of the plurality of battery packs is stored in the power supply device, reading the total capacity of each of the plurality of battery packs.

In a described example the measuring method further includes: calculating a remaining discharge time of the portable electrical energy system, where the remaining discharge time of the portable electrical energy system is equal to the remaining electric quantity of the portable electrical energy system divided by a discharging current of the portable electrical energy system, where the discharging current of the portable electrical energy system is equal to a sum of discharging currents of the battery packs.

In a described example, the measuring method further includes steps of: determining whether the each accessed battery pack is in a charging state; in response to determining that each of the plurality of battery packs is in the charging state, reading a lowest single cell voltage of each of the plurality of battery packs; and calibrating the initial electric quantity percentage of each of the plurality of battery packs according to the lowest single cell voltage of each of the plurality of battery packs.

In a described example, the initial electric quantity percentage of each of the plurality of battery packs is calibrated according to the lowest single cell voltage and an electric quantity percentage curve of each of the plurality of battery packs.

In a described example a portable electrical energy system includes a battery pack, which is at least capable of supplying power to an electric tool; and a power supply device, which is configured for outputting electrical energy from the battery pack or inputting electrical energy to the battery pack; where the power supply device includes: a battery pack interface, which is configured for accessing the battery pack; and a battery management system (BMS) control module, which is configured to: acquire a total capacity and an initial electric quantity percentage of each battery pack; detect a discharging current and a discharging time of each of the plurality of battery packs; calculate a discharging capacity of each of the plurality of battery packs, where the discharging capacity of each of the plurality of battery packs is equal to an integral of the discharging current and the discharging time of each of the plurality of battery packs; calculate currently a remaining electric quantity of each of the plurality of battery packs, where the remaining electric quantity of each of the plurality of battery packs is equal to a product of the total capacity of each of the plurality of battery packs and the initial electric quantity percentage minus the discharging capacity; calculate currently a real-time electric quantity percentage of each of the plurality of battery packs, where the real-time electric quantity percentage is equal to the remaining electric quantity of each of the plurality of battery packs divided by the total capacity of each of the plurality of battery packs; acquire an open circuit voltage of each of the plurality of battery packs and a real-time internal resistance of a cell unit of each of the plurality of battery packs; calculate currently a remaining electric quantity of each of the plurality of battery packs, and the remaining electric quantity is equal to a ratio of a difference between the open circuit voltage and a discharge cut-off voltage of each of the plurality of battery packs to the real-time internal resistance of the cell unit; and calculate a remaining electric quantity of the portable electrical energy system, where the remaining electric quantity of the portable electrical energy system is equal to a sum of remaining electric quantities of battery packs accessed to the power supply device.

In a described example, the BMS control module is configured to: calculate the open circuit voltage of each of the plurality of battery packs according to an electric quantity percentage curve of each of the plurality of battery packs.

In a described example, the BMS control module is configured to: calculate the real-time internal resistance of the cell unit according to a cell internal resistance table of each of the plurality of battery packs.

In a described example, a measuring method for acquiring a remaining electric quantity of a battery pack includes steps of:

acquiring a total capacity and an initial electric quantity percentage of the battery pack;

detecting a discharging current and a discharging time of the battery pack;

calculating a discharging capacity of the battery pack, where the discharging capacity of the battery pack is equal to an integral of the discharging current and the discharging time of the battery pack;

calculating currently an initial remaining electric quantity of the battery pack, where the initial remaining electric quantity of the battery pack is equal to a product of the total capacity of the battery pack and the initial electric quantity percentage minus the discharging capacity;

calculating currently a real-time electric quantity percentage of the battery pack, where the real-time electric quantity percentage is equal to a remaining electric quantity of the battery pack divided by the total capacity of the battery pack;

acquiring an open circuit voltage of the battery pack and a real-time internal resistance of a cell unit of the battery pack; and calculating currently a remaining electric quantity of the battery pack, where the remaining electric quantity is equal to a ratio of a difference between the open circuit voltage and a discharge cut-off voltage of the battery pack to the real-time internal resistance of the cell unit.

Further, the open circuit voltage of the battery pack is calculated according to an electric quantity percentage curve of the battery pack.

In a described example, the present disclosure further provides a power supply device, including: a housing; a plurality of battery pack ports, which are disposed on the housing to access a plurality of battery packs; a charging unit, which is electrically connected to the plurality of battery pack ports to charge the plurality of battery packs; and a battery management system (BMS) control unit, which is configured to: acquire a plurality of voltages accessed to the plurality of battery packs; output a single control signal to a battery pack with a lowest voltage among the plurality of battery packs to charge the battery pack with the lowest voltage to a first preset voltage; and output a plurality of control signals to the plurality of battery packs to charge the plurality of battery packs simultaneously.

In a described example, the BMS control unit outputs the plurality of control signals to the plurality of battery packs to charge the plurality of battery packs to a second preset voltage simultaneously.

In a described example, the first preset voltage is smaller than the second preset voltage.

In a described example, the first preset voltage is a voltage of a battery pack with a second lowest voltage among the plurality of battery packs.

In a described example, the charging unit includes: an electronic switch, which is electrically connected to the plurality of battery pack ports; where in response to determining that the plurality of battery packs accesses the plurality of battery pack ports, the BMS control unit outputs a control signal that enables the electronic switch to be turned on.

In a described example, the present disclosure provides a charging method for charging a plurality of battery packs, including steps of: acquiring a voltage of each of the plurality of battery packs; charging a battery pack with a lowest voltage among the plurality of battery packs to charge the battery pack with the lowest voltage to a first preset voltage; and charging the plurality of battery packs simultaneously.

In a described example, the plurality of battery packs is charged to a second preset voltage simultaneously.

In a described example, the first preset voltage is smaller than the second preset voltage.

In a described example, the first preset voltage is a voltage of a battery pack with a second lowest voltage among the plurality of battery packs.

In a described example, the present disclosure provides a charging method for charging a plurality of battery packs, including steps of: acquiring voltages of the plurality of battery packs; charging a battery pack with a lowest voltage among the plurality of battery packs to charge the battery pack with the lowest voltage to a first preset voltage; charging a battery pack with a second lowest voltage among the plurality of battery packs to charge the battery pack with the second lowest voltage to a third preset voltage; and charging the plurality of battery packs to a second preset voltage simultaneously; where the first preset voltage is smaller than the third preset voltage; the third preset voltage is smaller than the second preset voltage.

DETAILED DESCRIPTION

The present disclosure will be specifically described below with reference to the drawings and specific examples.

Figure 1:
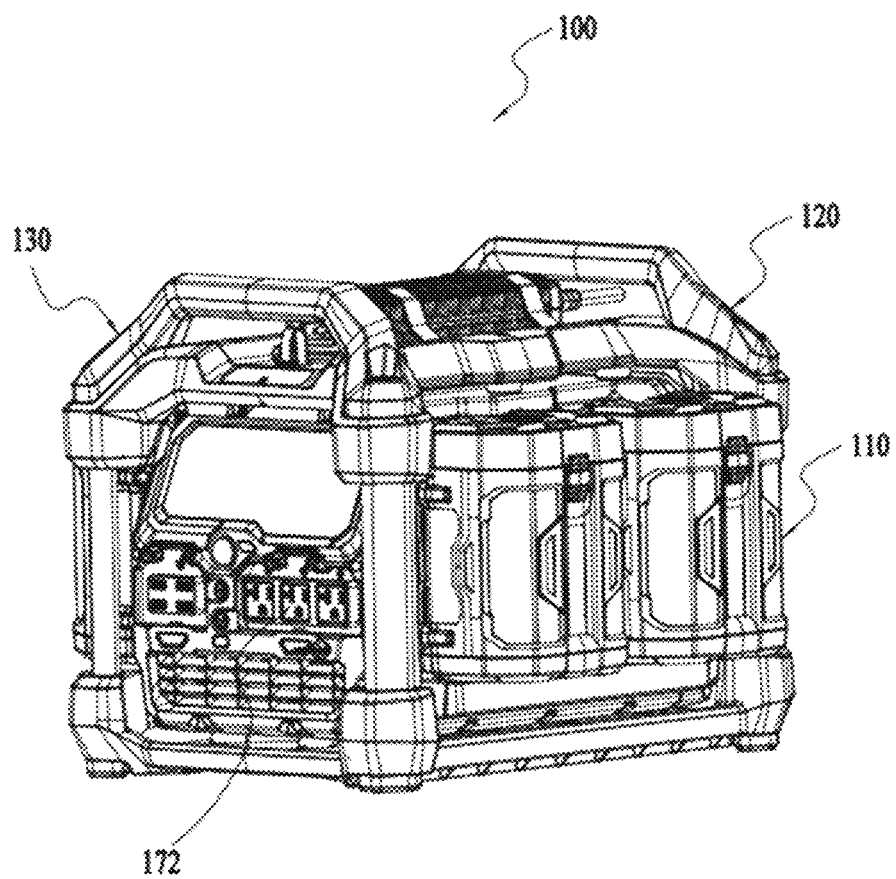
FIG. 1 is a perspective view of a portable electrical energy system according to an example.

Referring to FIGS. 1 to 4, a portable power energy system 100 includes a battery pack 110, a charger 120 and a power supply device 130. The power device 130 includes a battery pack port 132 and a housing 131. The battery pack port 132 is disposed on the housing 131 of the power supply device 130 for receiving the battery pack 110. Specifically, the housing 131 of the power supply device 130 is provided with a plurality of battery pack ports 132. In some examples, the number of battery pack ports 132 is four (as shown in FIG. 1), and in other examples, the number of battery pack ports 132 is two or more, which is not limited specifically in the present application.

Figure 4:
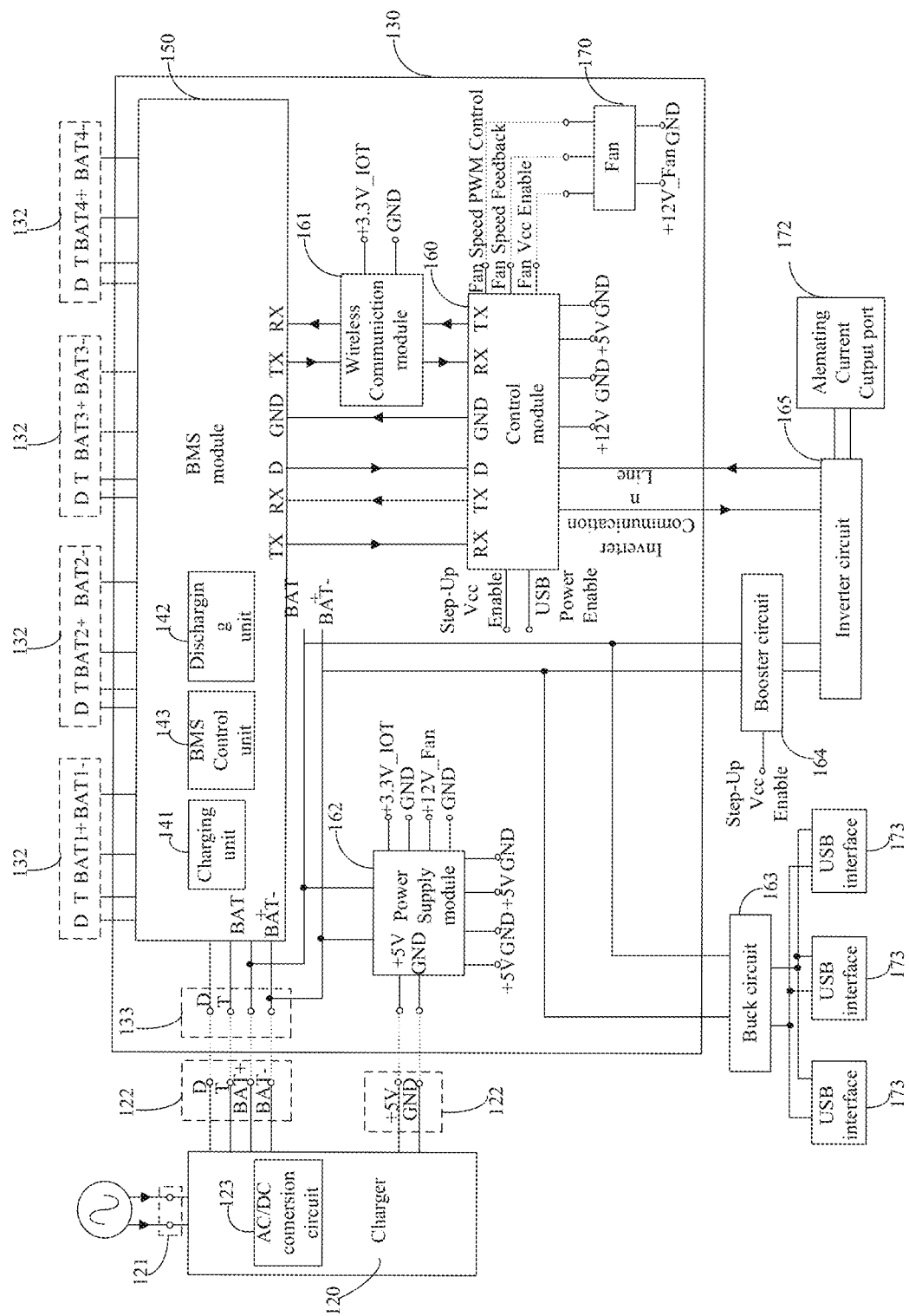
FIG. 4 is a circuit block diagram of the portable electrical energy system of FIG. 1.

In some specific examples, the battery pack port 132 includes a positive terminal BAT+, a negative terminal BAT−, a signal terminal D, and a temperature terminal T, as shown in FIG. 4. In other specific examples, the battery pack port 132 includes a positive terminal BAT+, a negative terminal BAT−, and a signal terminal D.

The power supply device 130 may be used for charging and/or discharging the battery packs 110 with different types. For example, the battery pack 110 may be a lithium battery pack, a lithium-based battery pack, a solid-state battery pack, or a graphene battery pack. In some examples, the power supply device 130 is operable to receive and charge and/or discharge the battery packs with different voltages, different capacities, different configurations, different shapes and different sizes. For example, the power supply device 130 can charge or discharge a battery pack with a rated voltage of 18V, 20V, 24V, 28V, 30V, 56V, greater than 56V etc. Alternatively, the power supply device 130 can charge or discharge the battery pack with a rated voltage within the above voltage range. The battery device can also charge or discharge a battery pack with a battery capacity of 1.2 Ah, 1.3 Ah, 1.4 Ah, 2.0 Ah, 2.4 Ah, 2.6 Ah, and 3.0 Ah.

The charger 120 includes an alternating current interface 121, a charger output interface 122, and an alternating current-direct current (AC-DC) conversion circuit 123. The alternating current interface 121 is connected to alternating current mains power, such as 110V or 220V. The AC-DC conversion circuit 123 is used for converting the accessed alternating current mains power into a direct current, and the charger output interface 122 outputs the direct current converted by the AC-DC conversion circuit 123. In some examples, the charger output interface 122 is electrically connected to a charging port 133 of the power supply device 130 through an external cable. In other examples, the charger output interface 122 is directly, for example, in a plug-in manner, electrically connected to the charging port 133 of the power supply device 130. In other examples, the charger 120 is built in the power supply device 130, and at this time, the charger output interface 122 and the charging port 133 are both located inside the power supply device 130, and the charger output interface 122 and the charging port 133 are electrically connected through an internal wire. In some examples, the charger 120 includes two charger output interfaces 122, the AC-DC conversion circuit 123 of the charger 120 is used for converting the alternating current into the direct current, for example, +5V or +12V, one of the two charger output interfaces is used for outputting the direct current of +5V or +12V, and the other of the charger output interfaces is directly or indirectly connected to the charging port 133 of the power supply device 130.

Figure 2:
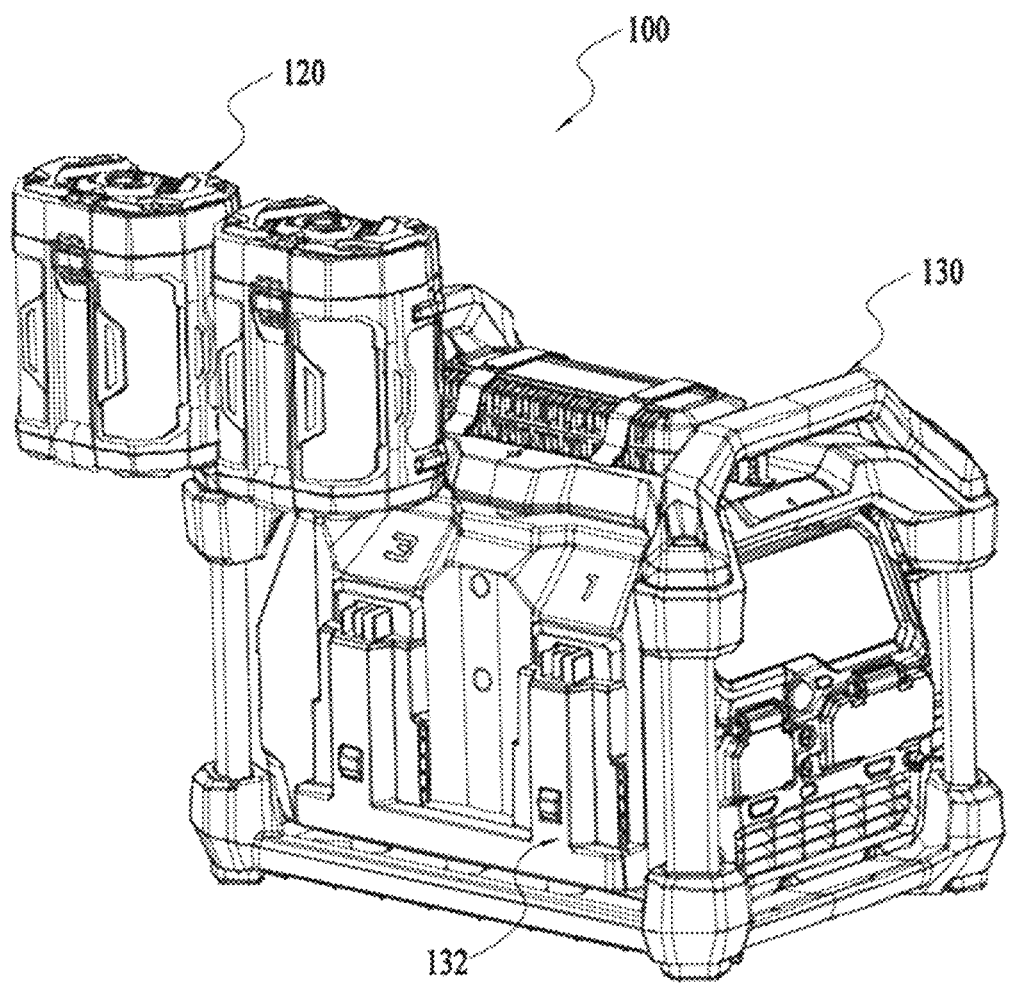
FIG. 2 is a structural view of a battery pack and a power supply device separated from each other in the portable electrical energy system of FIG. 1.
Figure 3:
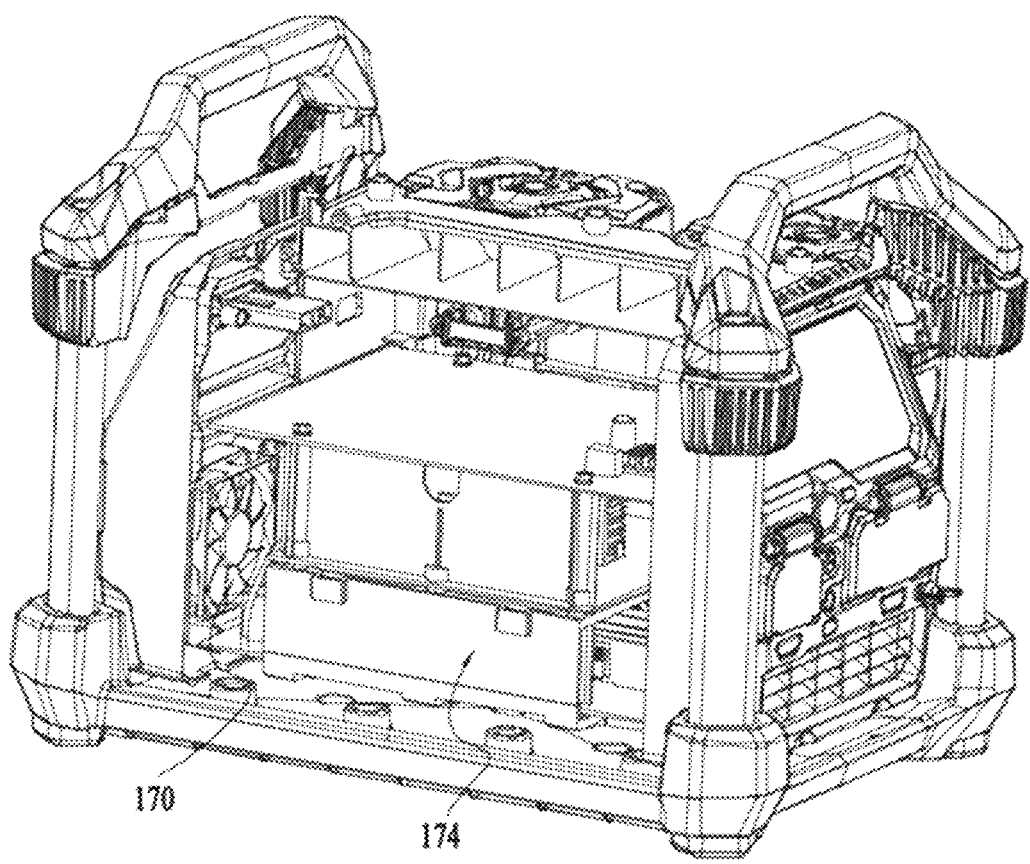
FIG. 3 is an internal structure view of a power supply device of the portable electrical energy system shown in FIG. 1.

Referring to FIG. 2, the power supply device 130 further includes a BMS module 140, a power supply module 162, a control module 160, a fan 170, a buck circuit 163, a booster circuit 190, and an inverter circuit 191 which are located in the housing 131.

The BMS module 140 includes software and hardware for controlling the power supply device 130, providing protection for the power supply device 130 (for example, overvoltage and overcurrent protection), controlling a charging current and a charging voltage of the power supply device 130, receiving related information from the battery pack 110, monitoring a temperature of the battery pack 110, and the like. In some examples, the BMS module 140 includes a circuit board provided with a plurality of electronic components to provide operations of controlling and protecting the charger 120. In some examples, the circuit board includes a control and processing unit such as a microprocessor, a microcontroller, or another similar component. In some examples, the control module 160 includes a processing unit, a storage unit, and a bus. The bus connects the processing unit and the storage unit in the control module 160. The storage unit may be a read only memory (ROM) or a random access memory (RAM). The control module 160 further includes an input and an output system for transmitting information of each unit of the control module 160 and information between the control module 160 and other modules of the charger 120. The software includes control programs written into the microprocessor and microcontroller.

Specifically, the BMS module 140 is electrically connected to the battery pack port 132 to achieve charge and discharge management of the battery pack 110. Specifically, the BMS module 140 includes a charging unit 141, a discharging unit 142, and a BMS control unit 143.

A power supply module 162 is electrically connected to the charging port 133, and is used for converting the electrical energy input through the charging port into different power supply electrical energy to supply power to the BMS module 140, the control module 160, and a display module of the charger, respectively.

A buck circuit 163 is electrically connected to the charging port 133, and is used for converting a direct current with a higher voltage input through the charging port into a direct current with a lower voltage for output, such as a direct current of +5V or +12V. In some examples, the direct current with a lower voltage stepped down by the buck circuit 163 is output through a universal serial bus (USB) interface, thereby enabling the power supply device to power the USB interface device.

A booster circuit 164 is electrically connected to the charging port 133 and is used for boosting a direct current voltage input through the charging port to a direct current voltage with a higher voltage, and then the direct current voltage with a higher voltage is inverted to an alternating current through the inverter circuit 165 and is output through an alternating current output port 172, thereby enabling the power supply device to supply power for a device using the alternating current.

Figure 5:
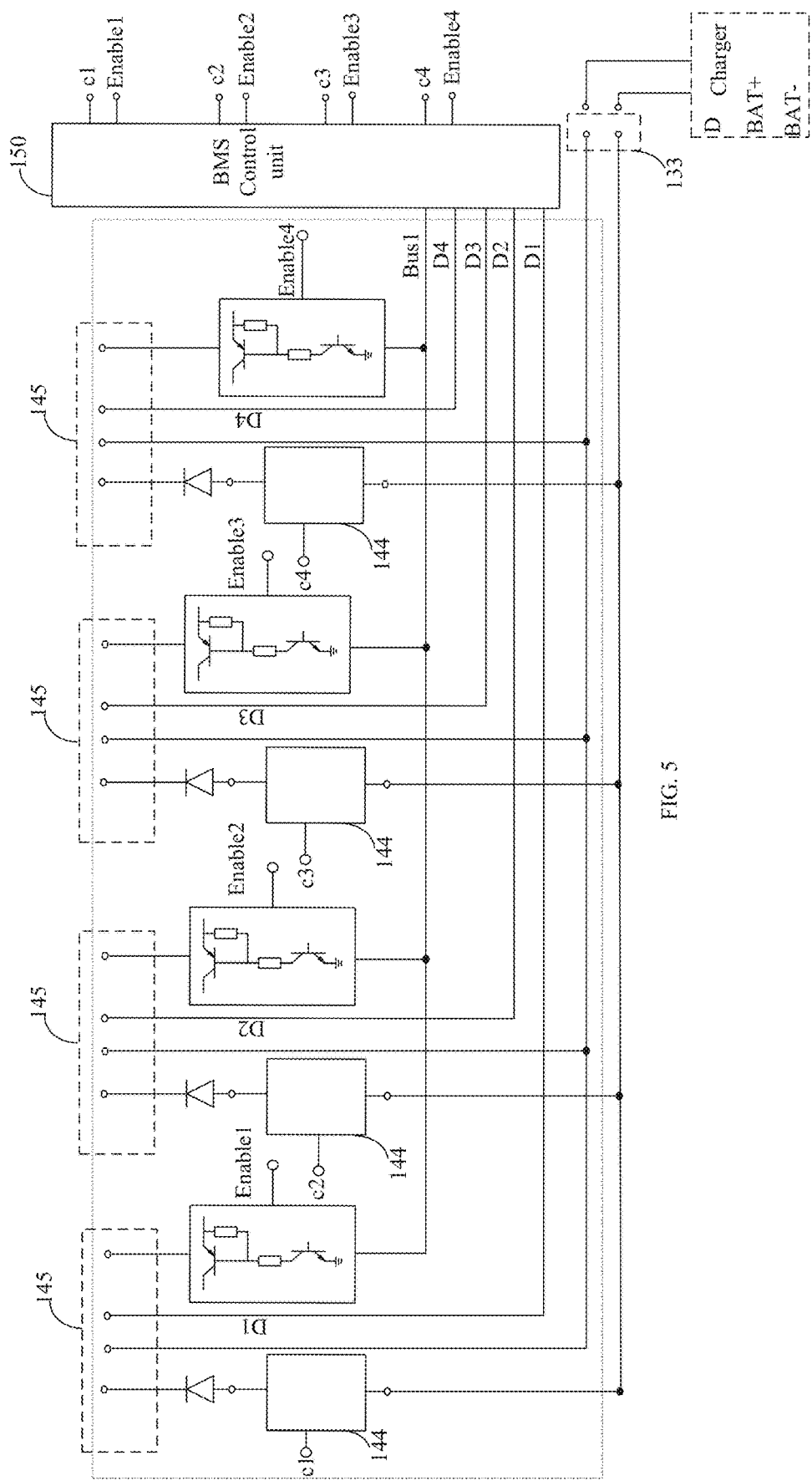
FIG. 5 is a circuit diagram of a charging unit of FIG. 4.

Referring to FIG. 5, the charging unit 141 includes the charging port 133, an electronic switch 144, and an output port 145, and the charging port 133 is electrically connected to the charger output interface 122 to access a charging current from the charger 120. In some examples, the output port 145 is the battery pack port 132; in other examples, the output port 145 is electrically connected to the battery pack port 132. The electronic switch 144 includes two contact terminals a and b and an enable terminal c, and the two contact terminals are connected in series between the charging port 133 and the output port 145. The enable terminal and the BMS control unit 143 are used for receiving a control signal from the BMS control unit 143 to control the electronic switch 144 to be turned on or off. In some examples, the electronic switch 144 is a relay; in other examples, the electronic switch 144 is a power switch transistor.

In condition that the electronic switch 144 is turned on, the charging port 133 establishes an electrical connection with the output port 145 to enable the charging unit 141 to charge the accessed battery pack 110; in condition that the electronic switch 144 is turned off, an electrical connection between the charging port 133 and the output port 145 is disconnected, and at this time, the charging unit 141 cannot charge the accessed battery pack 110.

Figure 6:
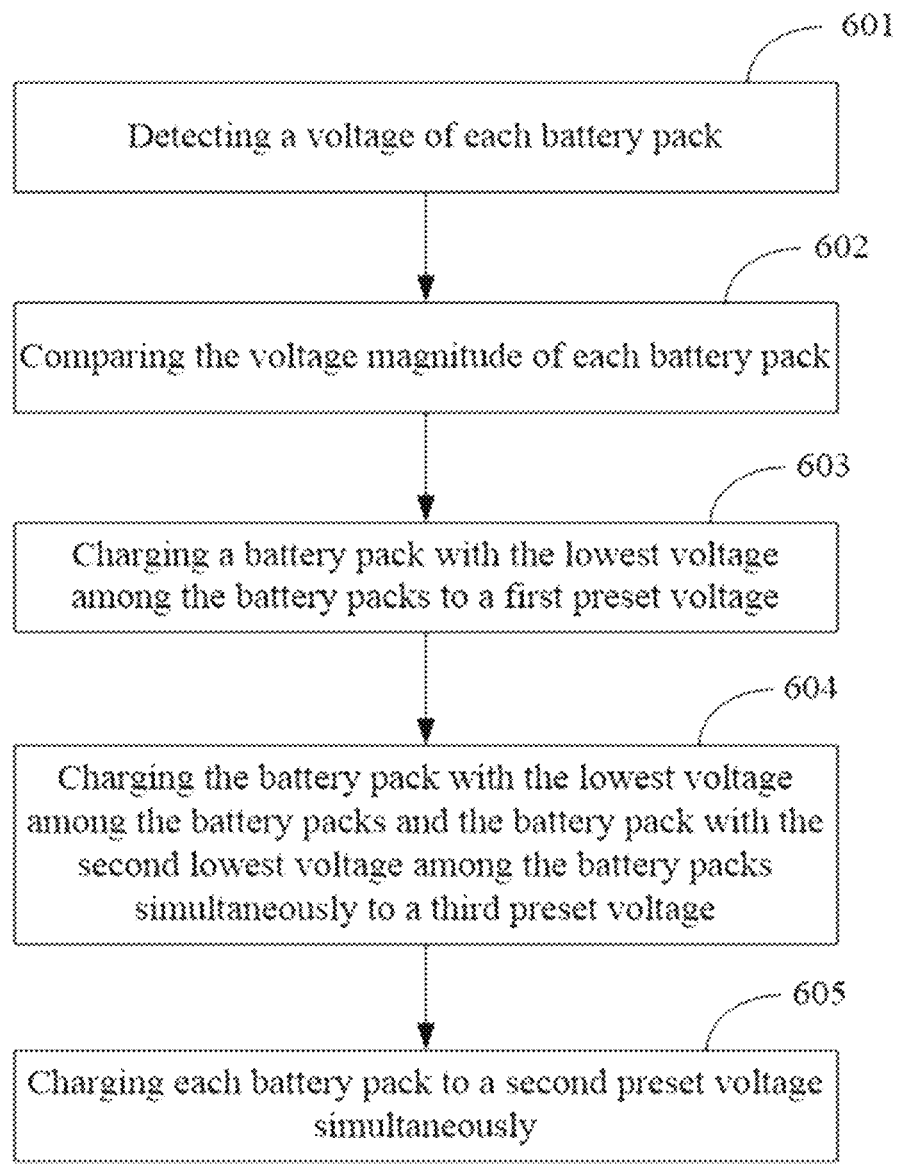
FIG. 6 is a charging flowchart for charging battery packs of a portable electrical energy system according to an example.

A charging logic for charging the battery pack 110 by the charging unit 141 will be described below with reference to FIG. 6. For convenience of description, four battery packs 110 accessing the power supply device 130 is taken as an example.

The four battery packs 110 are inserted into the battery pack ports 132 of the power supply device 130 respectively, and the BMS control unit 143 reads a remaining voltage of each battery pack 110 and sends a control signal to the battery pack 110 with the lowest voltage among the four battery packs 110 to charge the battery pack 110 with the lowest voltage to a preset voltage; the BMS control unit 143 then sends a control signal to the battery pack 110 with the second lowest voltage among the four battery packs 110 to charge the battery pack 110 to a preset voltage; the BMS control unit 143 then sends a control signal to the four battery packs 110 to charge the four battery packs 110 at the same time, and does not stop charging until the four battery packs 110 are fully charged.

Reference is made to a flowchart of a charging method for charging a plurality of battery packs shown in FIG. 6, and the charging method includes steps described below. For convenience of description, four battery packs are still used as an example for description here.

In S601, a voltage of each battery pack 110 is detected.

In some examples, a System-on-Chip (SOC) chip detects the voltage of each accessed battery pack.

In S602, the voltage magnitude of each battery pack 110 is compared.

In some examples, the BMS control unit 143 is electrically connected to the SOC chip, receives the voltage of each battery pack 110 detected by the SOC chip, and compares the voltage magnitude of each battery pack 110 according to the voltage of each battery pack 110.

In S603, a battery pack with the lowest voltage among the battery packs 110 is charged to a first preset voltage, where a value range of the first preset voltage is less than or equal to a voltage of a battery pack with the second lowest voltage among the battery packs.

In some examples, the BMS control unit 143 outputs a single control signal to the battery pack with the lowest voltage among the battery packs to charge the battery pack with the lowest voltage among the battery packs to the first preset voltage, where the first preset voltage is a voltage of the battery pack with the second lowest voltage among the battery packs. In this way, after step S603 is completed, the voltage of the battery pack with the lowest voltage among the battery packs is equal to the voltage of the battery pack with the second lowest voltage among the battery packs.

In S604. the battery pack with the lowest voltage among the battery packs and the battery pack with the second lowest voltage among the battery packs are charged simultaneously to a third preset voltage, where a value range of the third preset voltage is less than or equal to a voltage of a battery pack with the second highest voltage among the battery packs.

In some specific examples, the BMS control unit 143 outputs a control signal to the battery pack with the lowest voltage among the battery packs and the battery pack with the second lowest voltage among the battery packs to charge the battery pack with the lowest voltage among the battery packs and the battery pack with the second lowest voltage among the battery packs to the third preset voltage, where the third preset voltage is the voltage of the battery pack with the second highest voltage among the battery packs. In this way, after step S604 is completed, the voltage of the battery pack with the lowest voltage and the voltage of the second lowest voltage among the battery packs are equal to the voltage of the battery pack with the second highest voltage among the battery packs. The third preset voltage is greater than the first preset voltage.

In S605, each battery pack is charged to a second preset voltage simultaneously. A value range of the second preset voltage is greater than the third preset voltage and less than or equal to a full charge voltage of the battery pack.

In some examples, the BMS control unit 143 outputs a control signal to each battery pack so that each battery pack is simultaneously charged to the second preset voltage, where the second preset voltage is a voltage of the battery pack with the lowest full charge voltage among the four battery packs.

The advantage of using the above charging method to charge the battery pack accessed to the power supply device 130 is to ensure that the charging voltage deviation of each accessed battery pack is small, so that when the battery pack needs to be discharged to provide energy for the electric device, after the battery pack is inserted into the power supply device, the power supply device can be quickly discharged, thereby improving the working efficiency of the power supply device.

Figure 7:
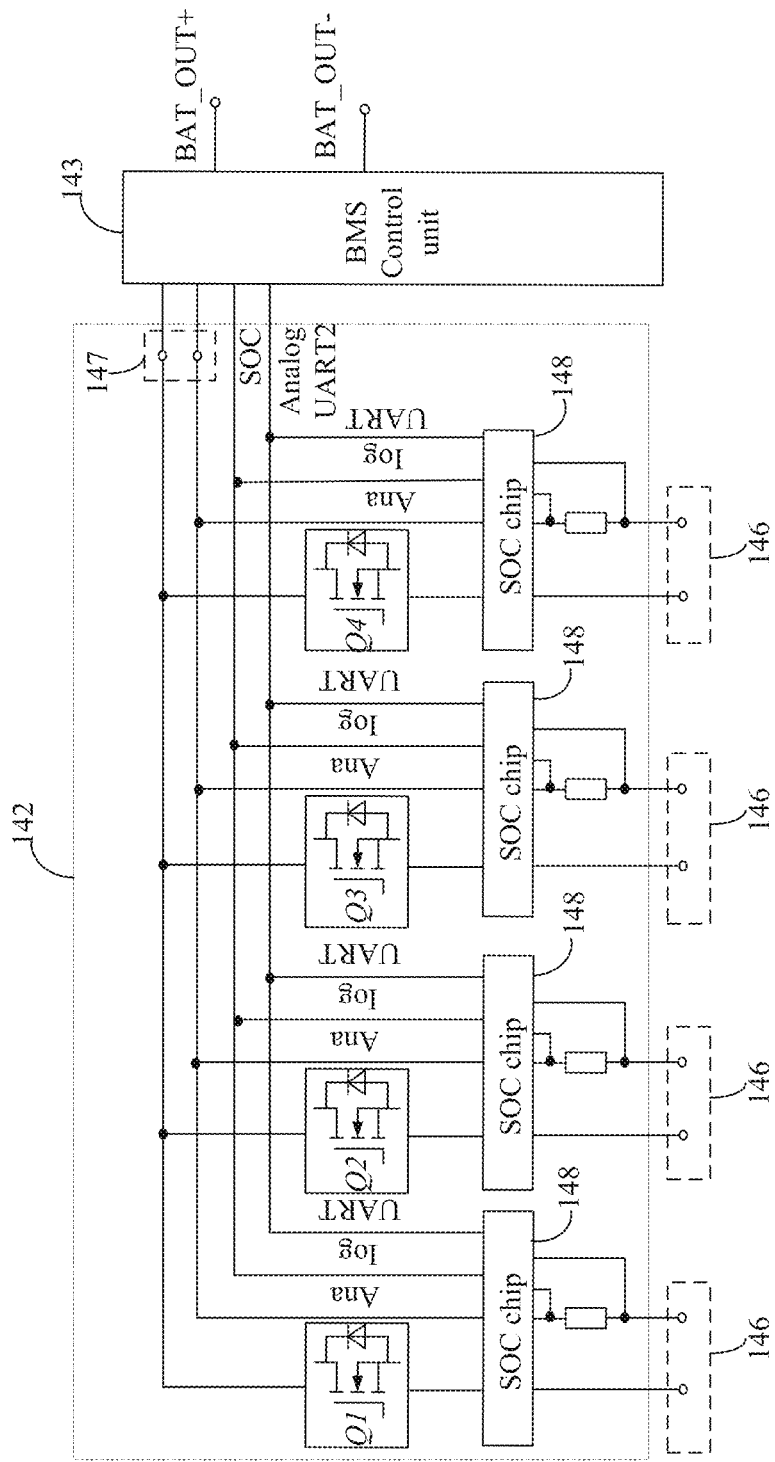
FIG. 7 is a circuit diagram of a discharging unit according to an example.

Referring to FIG. 7, the discharging unit 142 is used for enabling the battery pack 110 to output electrical energy. An input terminal 146 of the discharging unit 142 is electrically connected to the battery pack port 132, and an output terminal 147 of the discharging unit 142 is electrically connected to the BMS control unit 143. The discharging unit 142 includes an SOC chip 148, and reads identity (ID) information of the battery pack 110 when the battery pack 110 is accessed to the battery pack port 132. The ID information of the battery pack includes information such as a total capacity of the battery pack, a type of the battery pack, a voltage of a single cell of the battery pack, the number of charge and discharge cycles, an initial electric quantity percentage of the battery pack, a temperature of the battery pack, and a discharge cut-off voltage of the battery pack.

In some specific examples, the input terminal of the discharging unit 142 is the battery pack port 132 to electrically connect a terminal of the battery pack to the discharging unit 142. In some other specific examples, the input terminal of the discharging unit 142 is electrically connected to the battery pack port 132 to electrically connect the terminal of the battery pack 110 to the discharging unit 142.

In some examples, due to the fact that the voltage of the battery pack 110 accessed to each battery pack port 132 is different, the charging unit 142 reads the voltage of each accessed battery pack 110, and the BMS control unit 143 sends a control signal to the battery pack 110 with the highest voltage to enable the battery pack 110 with the highest voltage to be discharged first and does not send a control signal to each accessed battery pack 110 to discharge the battery packs 110 in parallel until the voltage of each accessed battery pack 110 is substantially the same.

Figure 8:
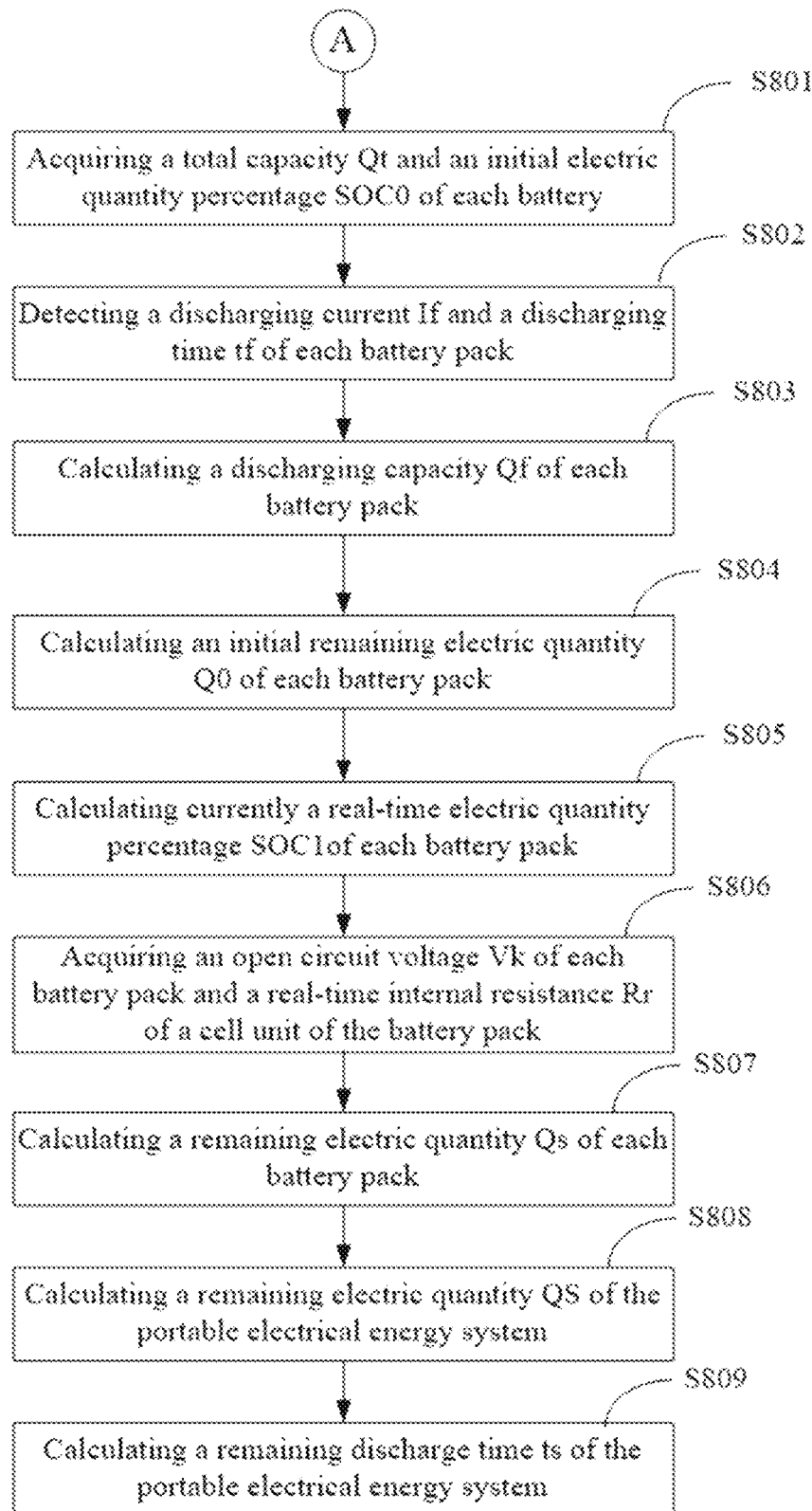
FIG. 8 is a flowchart for calculating a remaining electric quantity of a battery pack of a portable electrical energy system according to an example.

Reference is made to a measuring method for a portable electrical energy system shown in FIG. 8, where the portable electrical energy system includes a power supply device 130 and a plurality of battery packs 110 detachably connected to the power supply device 130. The measuring method includes steps described below.

In S801, a total capacity Qt and an initial electric quantity percentage SOC0 of each battery are acquired.

In some examples, the battery pack is accessed to the battery pack interface of the power supply device, and the discharging unit reads ID information of each battery pack. Specifically, an SOC chip reads the total capacity and initial electric quantity percentage of each battery pack.

In S802, a discharging current If and a discharging time tf of each battery pack 110 are detected.

In some examples, the discharging unit 142 reads the discharging current and discharging time of each battery pack. Specifically, the discharging unit 142 includes a current detection circuit, such as a detection resistor or a current sensor and another circuit that can detect the discharging current of the battery pack. In some examples, the discharging unit 142 includes a timer for recording the discharging time of each battery pack. Apparently, the timer can also be located in the power supply device as a separate clock module.

In S803, a discharging capacity Qf of each battery pack 110 is calculated, where the discharging capacity of each battery pack 110 is equal to an integral of the discharging current and the discharging time of the battery pack 110, that is:

$$Qf = \int_0^{tf} If(tf)dtf$$

In S804, an initial remaining electric quantity Q0 of each battery pack 110 is calculated, where the initial remaining electric quantity of the battery pack 110 is equal to a product of the total capacity Qt of the battery pack 110 and the initial electric quantity percentage SOC0 minus the discharging capacity Qf, that is:

$$Q0 = Qt \cdot SOC0 - Qf.$$

In some examples, the discharging unit 142 includes a calculation subunit that calculates the discharging capacity and the remaining electric quantity of each battery pack 110. In other examples, the discharging unit 142 includes an SOC chip, and the SOC chip has a calculation unit that calculates the discharging capacity and the remaining electric quantity of each battery pack. In other examples, the BMS control unit 143 includes a calculation subunit that calculates the discharging capacity and remaining electric quantity of each battery pack.

In S805, a real-time electric quantity percentage SOC1 of each battery pack is calculated currently, where the real-time electric quantity percentage is equal to the initial remaining electric quantity Q0 of the battery pack divided by the total capacity Qt of the battery pack, that is:

$$SOC1 = Q0/Qt.$$

In S806, an open circuit voltage Vk of each battery pack and a real-time internal resistance Rr of a cell unit of the battery pack are acquired.

In some examples, the open circuit voltage Vk of the battery pack 110 is calculated according to the electric quantity percentage curve of the battery pack.

Figure 9:
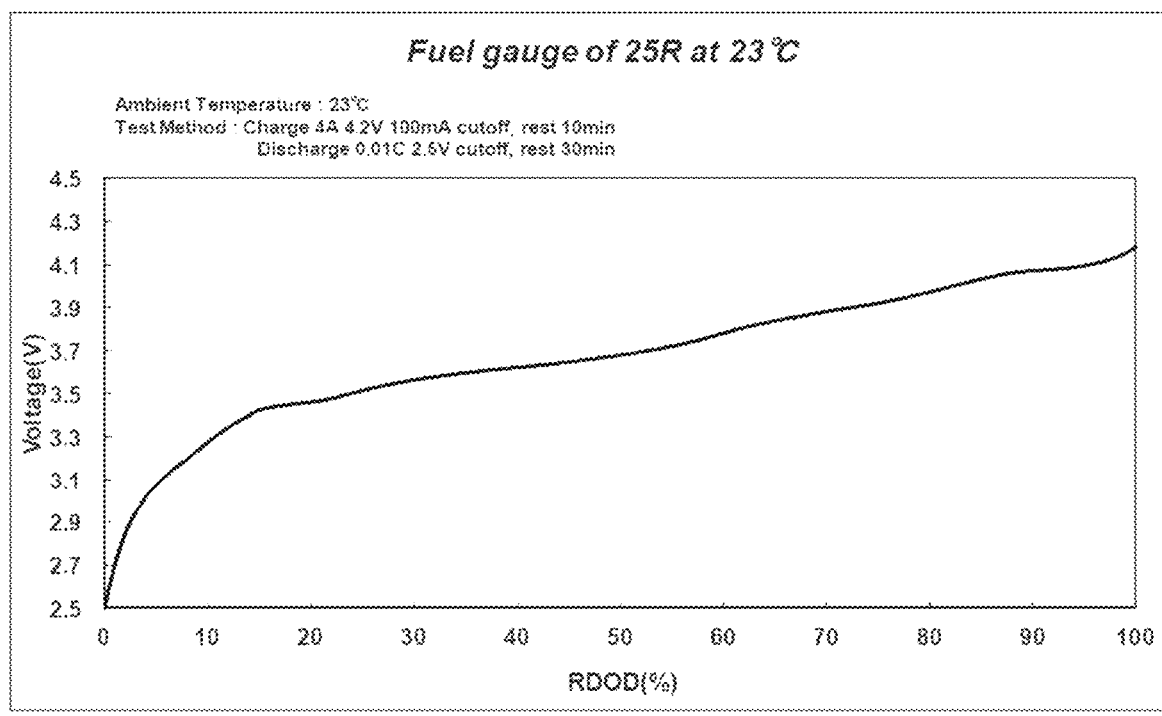
FIG. 9 is a curve illustrating a relationship between an electric quantity percentage of a battery pack and an open circuit voltage of the battery pack.

Referring to FIG. 9, a curve illustrating a relationship between the electric quantity percentage of the battery pack and the open circuit voltage of the battery pack is shown. In the figure, the abscissa represents the electric quantity percentage, and the ordinate represents the open circuit voltage of the battery pack. The open circuit voltage of the battery pack is a voltage of a single cell with the lowest voltage of the battery pack. When the battery pack is shipped from the factory, the curve of the open circuit voltage and the electric quantity percentage of the battery pack 110 have been basically determined.

In some examples, the power supply device 130 further includes a storage module for storing the curve illustrating the relationship between the electric quantity percentage of the battery pack and the open circuit voltage of the battery pack. Specifically, the storage module stores a data table listing the correspondence between the electric quantity percentage of the battery pack 110 and the open circuit voltage of the battery pack 110. After the real-time electric quantity percentage SOC1 of the battery pack is calculated in step S405, the BMS control unit 143 calls the relationship curve or relationship table of the electric quantity percentage of the battery pack and the open circuit voltage of the battery pack stored in the storage module, and looks up a corresponding open circuit voltage Vk of the battery pack according to the calculated real-time electric quantity percentage SOC1 of the battery pack to obtain the open circuit voltage Vk of the battery pack. In this way, a more accurate open circuit voltage Vk of the battery pack can be obtained according to the calculated real-time electric quantity percentage SOC1, which reduces the measurement error of the open circuit voltage Vk of the battery pack.

In some examples, the real-time internal resistance Rr of the cell unit is calculated according to a cell internal resistance table of the battery pack.

Reference is made to Table 1 below which is an exemplary cell internal resistance table of the battery pack. The horizontal column in the table indicates a temperature, and the numerical column indicates the open circuit voltage of the battery pack. Specifically, the storage module also stores the cell internal resistance table of the battery pack. In some specific examples, the battery pack 110 includes a temperature detection circuit for detecting a temperature of the battery pack. Specifically, the temperature detection circuit detects a temperature of a cell in the battery pack 110. When the battery pack is inserted into the battery pack port 132, temperature information of the battery pack is transmitted to the BMS control unit 143 through the terminal of the battery pack port 132, and the BMS control unit 143 receives temperature data of the battery pack and open circuit voltage data corresponding to the battery pack and looks up the real-time internal resistance Rr of the cell unit in the cell internal resistance table according to the temperature data of the battery pack and the corresponding open circuit voltage data.

TABLE 1

| | T = 20° C. | −16 | −12 | −8 | −4 | 0 | 4 | 8 | 12 | 16 | 20 | 24 | 28 | 32 | 36 | 40 |
|---|---|---|---|---|---|---|---|---|---|---|---|---|---|---|---|---|
| VOC <= 2.85 V | 248 | 248 | 238 | 228 | 218 | 208 | 198 | 185 | 117 | 114 | 113 | 111 | 109 | 106 | 103 | 100 |
| 2.85 V < VOC <= 3 V | 207 | 207 | 197 | 187 | 177 | 167 | 157 | 144 | 95 | 92 | 91 | 90 | 87 | 84 | 82 | 79 |
| 3 V < VOC <= 3.15 V | 172 | 172 | 162 | 152 | 142 | 132 | 122 | 110 | 77 | 74 | 73 | 71 | 69 | 66 | 63 | 61 |
| 3.15 V < VOC <= 3.3 V | 144 | 144 | 134 | 124 | 114 | 104 | 94 | 82 | 62 | 59 | 58 | 56 | 54 | 51 | 48 | 45 |
| 3.3 V < VOC <= 3.45 V | 123 | 123 | 113 | 103 | 93 | 83 | 73 | 60 | 50 | 47 | 46 | 44 | 42 | 39 | 35 | 33 |
| 3.45 V < VOC <= 3.6 V | 107 | 107 | 97 | 87 | 77 | 68 | 58 | 45 | 41 | 38 | 37 | 36 | 33 | 30 | 28 | 25 |
| 3.6 V < VOC <= 3.75 V | 99 | 99 | 89 | 79 | 69 | 59 | 49 | 36 | 36 | 33 | 32 | 30 | 27 | 25 | 22 | 19 |
| 3.75 V < VOC <= 3.9 V | 96 | 96 | 86 | 76 | 66 | 56 | 46 | 34 | 33 | 31 | 29 | 28 | 25 | 23 | 20 | 17 |
| 3.9 V < VOC <= 4.05 V | 100 | 100 | 90 | 80 | 70 | 60 | 51 | 38 | 34 | 32 | 30 | 29 | 26 | 23 | 21 | 18 |

In S807, a remaining electric quantity Qs of each battery pack is calculated, where the remaining electric quantity Qs is equal to a ratio of the difference between the open circuit voltage Vk of the battery pack and a discharge cut-off voltage Vc of the battery pack to the real-time internal resistance Rr of the cell unit, that is:

$$Qs=(Vk-Vc)/Rr.$$

In some examples, the discharge cut-off voltage of the battery pack stored in the battery pack is transferred to the power supply device 130 through a signal terminal of the battery pack port 132 for the BMS control module 160 to call. In other examples, the power supply device 130 includes the storage module for storing the ID information of the battery pack and the corresponding discharge cut-off voltage of the battery pack.

The remaining electric quantity Qs of the battery pack is calculated according to the calibrated open circuit voltage Vk of the battery pack and the real-time internal resistance Rr of the cell unit, which reduces the measurement error of the remaining electric quantity of the battery pack and improves the accuracy of the remaining electric quantity of the battery pack.

In S808, a remaining electric quantity QS of the portable electrical energy system is calculated, where the remaining electric quantity QS of the portable electrical energy system is equal to a sum of remaining electric quantities Qs of all battery packs accessed to the power supply device 130.

In S809, a remaining discharge time ts of the portable electrical energy system is calculated, where and the remaining discharge time of the portable electrical energy system is equal to the remaining electric quantity QS of the portable electrical energy system divided by a discharging current I of the portable electrical energy system, that is:

$$ts=QS/I.$$

The discharging current I of the portable electrical energy system is equal to a sum of the discharging currents If of the all battery packs accessed to the battery pack ports 132.

Thus, the remaining discharge time of the portable electrical energy system is obtained, the error of the remaining discharge time of the portable electrical energy system is reduced, and the utilization efficiency of electrical energy of the battery pack can be improved.

In some examples, the control module 160 performs calculation to obtain the remaining discharge time ts of the portable electrical energy system according to the remaining electric quantity QS and the discharging current I of the portable electrical energy system. In other examples, the power supply device further includes a display module for displaying the remaining electric quantity QS and the remaining discharge time ts of the portable electrical energy system for the convene reading by a user. Specifically, the display module is a display screen. In other examples, the power supply device of the portable electrical energy system includes a wireless communication module 161, which is capable of communicating with mobile terminals such as mobile phones and wirelessly transmitting the remaining electric quantity QS and the remaining discharge time ts to a terminal interface for display.

When the battery pack 110 is accessed to the battery pack port 132, the control module 160 is configured to determine whether the accessed battery pack 110 is in a charging state or a discharging state.

Figure 10:
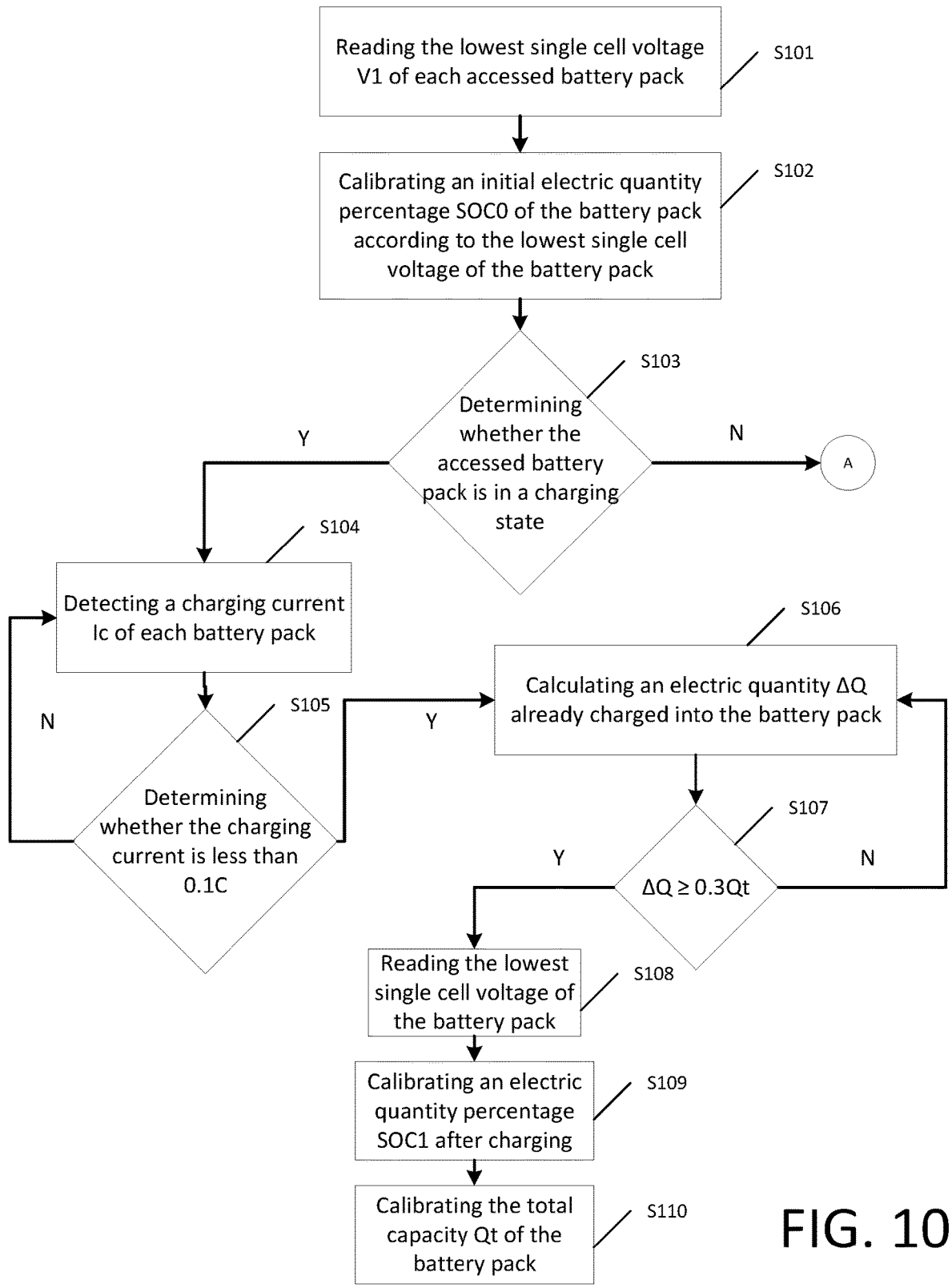
FIG. 10 is a flowchart for calibrating a total capacity of a battery pack according to an example.

Reference is made to a flowchart of a measuring method for a portable electrical energy system shown in FIG. 10. The measuring method further includes steps described below.

In S101, the lowest a single cell voltage V1 of each accessed battery pack is read.

In S102, an initial electric quantity percentage SOC0 of the battery pack is calibrated according to the lowest single cell voltage of the battery pack.

In S103, whether the accessed battery pack is in a charging state is determined; if the accessed battery pack is in the charging state, the process goes to step S104; if the accessed battery pack is not in the charging state, the process goes to step S108.

In some examples, whether the battery pack is in the charging state is determined by detecting whether a charging current is input. Specifically, a current of the charging port 133 is detected, and if a current flows from the charging port 133, it indicates that the battery pack is in the charging state.

In S104, a charging current Ic of each battery pack is detected.

In S105, whether the charging current is less than 0.1 C is determined, where C represents a nominal total capacity of the battery pack; if the charging current is not less than 0.1 C, the process returns to step S104, and if the charging current is less than 0.1 C, step S106 is performed.

In S106, an electric quantity AQ already charged into the battery pack is calculated, where the electric quantity AQ already charged into the battery pack is equal to an integral of the charging current Ic and a charging time t, that is:

$$\Delta Q = \int_0^t Ic\,dt.$$

In S107, whether the electric quantity already charged into the battery pack is greater than or equal to three tenths of a total capacity Qt of the battery pack; if the electric quantity already charged into the battery pack is not greater than or equal to three tenths of a total capacity Qt of the battery pack, the process returns to step S106, and if the electric quantity already charged into the battery pack is greater than or equal to three tenths of a total capacity Qt of the battery pack, step S108 is performed.

In S108, the lowest single cell voltage of the battery pack is read.

In S109, the lowest single cell voltage is used to calibrate an electric quantity percentage SOC1 after charging.

In S110, the total capacity Qt of the battery pack is calibrated, where:

$$Qt = \Delta Q/(SOC1-SOC0).$$

In some examples, the calibrated total capacity of the battery pack is brought into step S401 so that the measuring accuracy of the remaining electric quantity of the portable electrical energy system can be further improved.

All the above steps can be executed by a software program written into the BMS control module 160.

Figure 11:
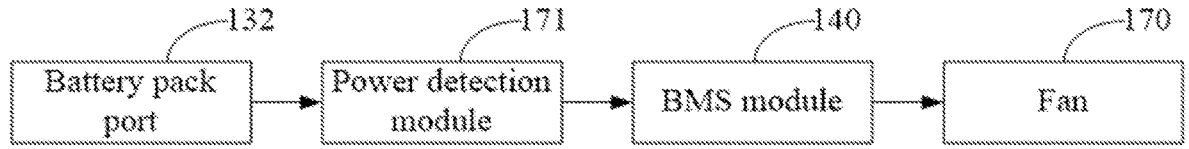
FIG. 11 is a circuit block diagram of a power supply device including a power detection module according to an example.
Figure 12:
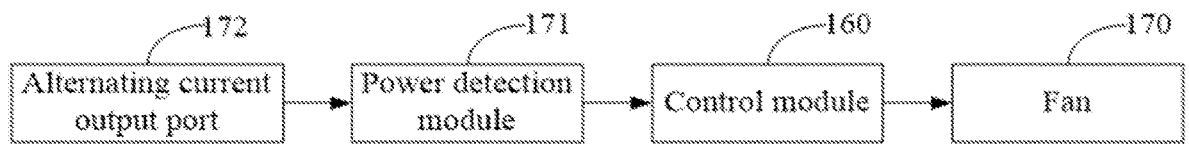
FIG. 12 is a circuit block diagram of a power supply device including a power detection module according to an example.

Referring to FIGS. 11 and 12, the power supply device 130 further includes an electronic assembly, a fan 170 and a power detection module 171. The electronic assembly is located in the housing 131, and the electronic assembly generates heat when the power supply device 130 is in operation. Specifically, the electronic assembly includes a circuit board located in the housing 131 and electronic components forming each circuit.

The rotation of the fan 170 causes an air flow in the housing 131 to dissipate heat from the electronic assembly. In some examples, the fan 170 is electrically connected to the BMS module 140, and receives a control signal from the BMS module 140 to adjust a rotation speed of the fan 170. In another example, the fan 170 is electrically connected to the control module 160, for example, a control chip independent of the BMS control board, and receives a control signal from the control module 160 to adjust the rotation speed of the fan 170.

The power detection module 171 is used for detecting an input power or an output power of the power supply device 130. In some examples, the power detection module 171 is electrically connected to the battery pack port 132 of the power supply device 130 for detecting the input power of the power supply device. In other examples, the power detection module 171 is electrically connected to the alternating current output interface 172 of the power supply device, for example, an output interface for outputting the alternating current, for detecting the output power of the power supply device 130. In other examples, the power detection module 171 is electrically connected to the battery pack port 132 of the power supply device 130 and the output interface of the power supply device 130 separately, for detecting the input power and the output power of the power supply device 130.

In some specific examples, the power detection module 171 includes a power chip and a peripheral circuit electrically connected to the power chip. In another specific example, the power detection module 171 includes a power detection circuit.

Figure 13:
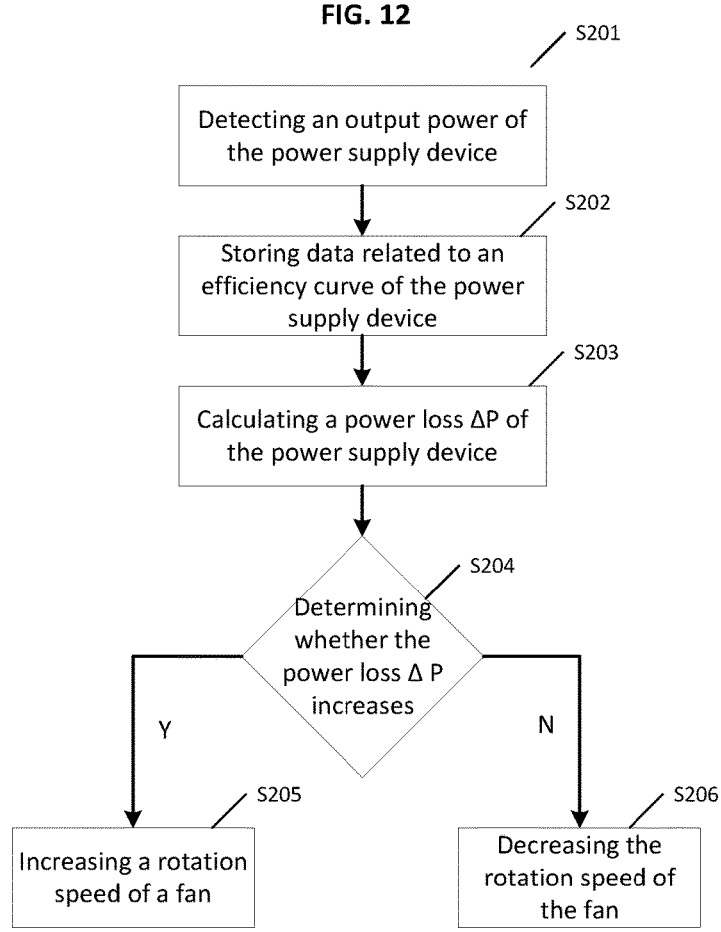
FIG. 13 is a flowchart of a method for fan speed adjustment of a power supply device according to an example.

A method for adjusting the rotation speed of the fan according to the input or output power of the power supply device in the power supply device with reference to FIG. 13 is described in details below. The method includes steps described below:

In S201, an output power of the power supply device is detected.

In some examples, the power detection module detects the output power of the power supply device.

In S202, data related to an efficiency curve of the power supply device is stored.

In some examples, the power supply device further includes a storage module that stores data related to the efficiency curve of the power supply device 130.

Figure 14:
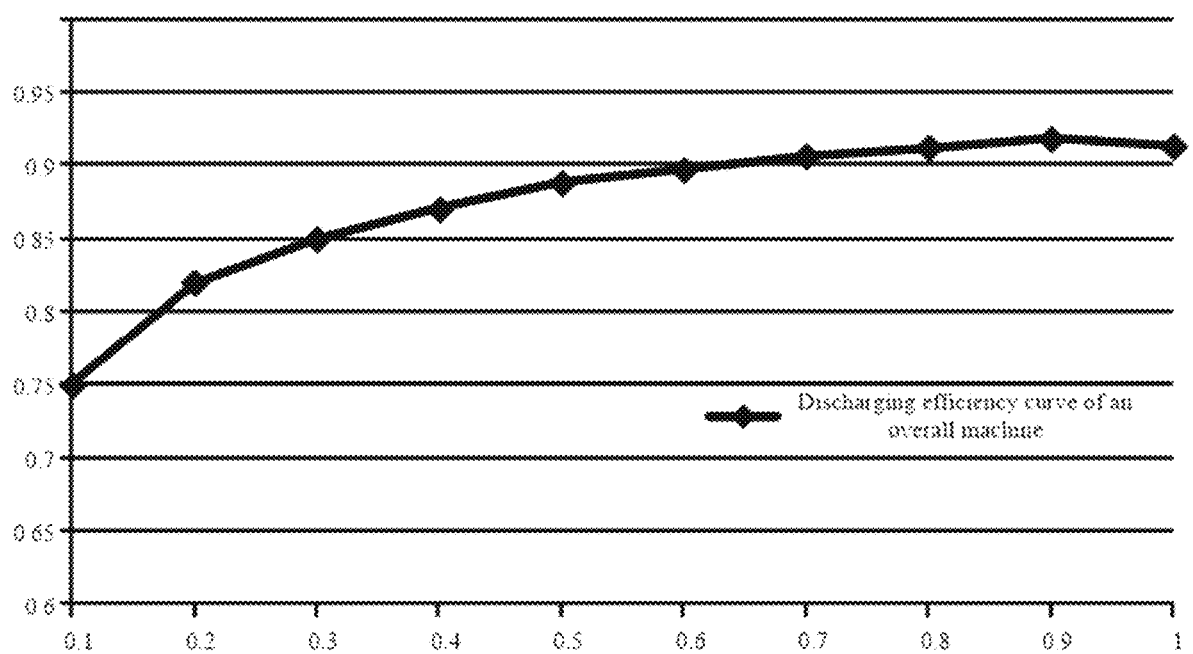
FIG. 14 is a graph of an overall discharging efficiency of a power supply device.

Reference is made to the efficiency graph of the power supply device shown in FIG. 14. In the figure, the abscissa indicates an output power of the power supply device, and the ordinate indicates efficiency. The storage module stores the output power of the power supply device and corresponding efficiency data.

In S203, a power loss ΔP of the power supply device 130 is calculated according to the output power Po of the power supply device and the data related to the efficiency curve of the power supply device.

In some examples, the control module calls the output power of the power supply device and the efficiency data corresponding to the output power stored in the storage module, and looks up the corresponding efficiency η according to the output power Po, and then calculates the power loss ΔP of the power supply device 130, that is:

$$\Delta P = Po/\eta - Po.$$

In S204, whether the power loss ΔP increases is determined, and if the power loss ΔP increases, step S205 is performed; if the power loss ΔP does not increase, step S206 is performed.

In some examples, the increase or decrease in power loss is determined through comparison of changes in power loss over time. In another example, the increase or decrease in power loss is determined through calculation of a slope of the power loss.

In S205, the rotation speed of the fan is increased.

Specifically, when the power loss increases, the control module outputs a control signal that enables the rotation speed of the fan to increase to the fan to increase the rotation speed of the fan, thereby increasing the flow of airflow in the power supply device to increase the heat dissipation speed.

In S206, the rotation speed of the fan is decreased.

Specifically, when the power loss decreases, the control module outputs a control signal that enables the rotation speed of the fan to decrease to the fan to decrease the rotation speed of the fan, thereby reducing the loss of electrical energy.

The above method can be executed by a software program written into the control module.

The change in power loss of the power supply device is used to adjust the rotation speed of the fan, so that an additional temperature detection unit is not needed for the power supply device, which reduces the cost and increases the heat dissipation efficiency of the power supply device.

Figure 15:
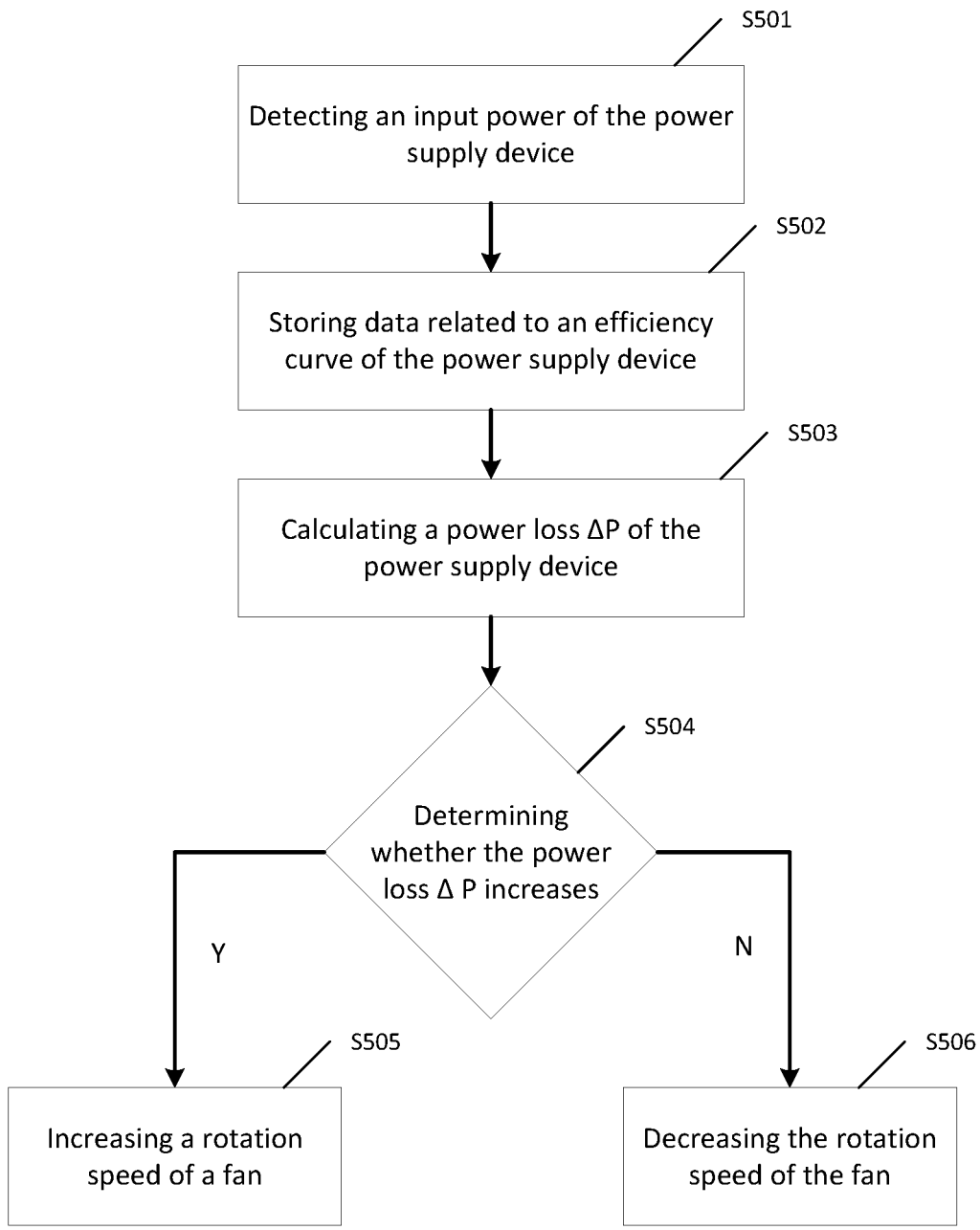
FIG. 15 is a flowchart of a method for fan speed adjustment of a power supply device according to an example.

Referring to FIG. 15, another method for adjusting the speed of the fan 170 for the power supply device 130 includes steps described below.

In S501, an input power Pi of the power supply device is detected.

In S502, data related to an efficiency curve of the power supply device is stored.

Specifically, the storage module stores the input power Pi of the power supply device and corresponding efficiency data η.

In S503, a power loss ΔP of the power supply device is obtained according to the input power Pi of the power supply device and the data related to the efficiency curve of the power supply device, where:

$$\Delta P = Pi \cdot \eta$$

In S504, whether the power loss ΔP increases is determined, and if the power loss ΔP increases, step S505 is performed; if the power loss ΔP does not increase, step S506 is performed.

In S505, the rotation speed of the fan is increased.

In S506, the rotation speed of the fan is decreased.

The above method can be executed by a software program written into the control module. The difference from the method shown in FIG. 13 is that the input power of the power supply device is detected in step S501, and the specific implementation is not repeated here.

Figure 16:
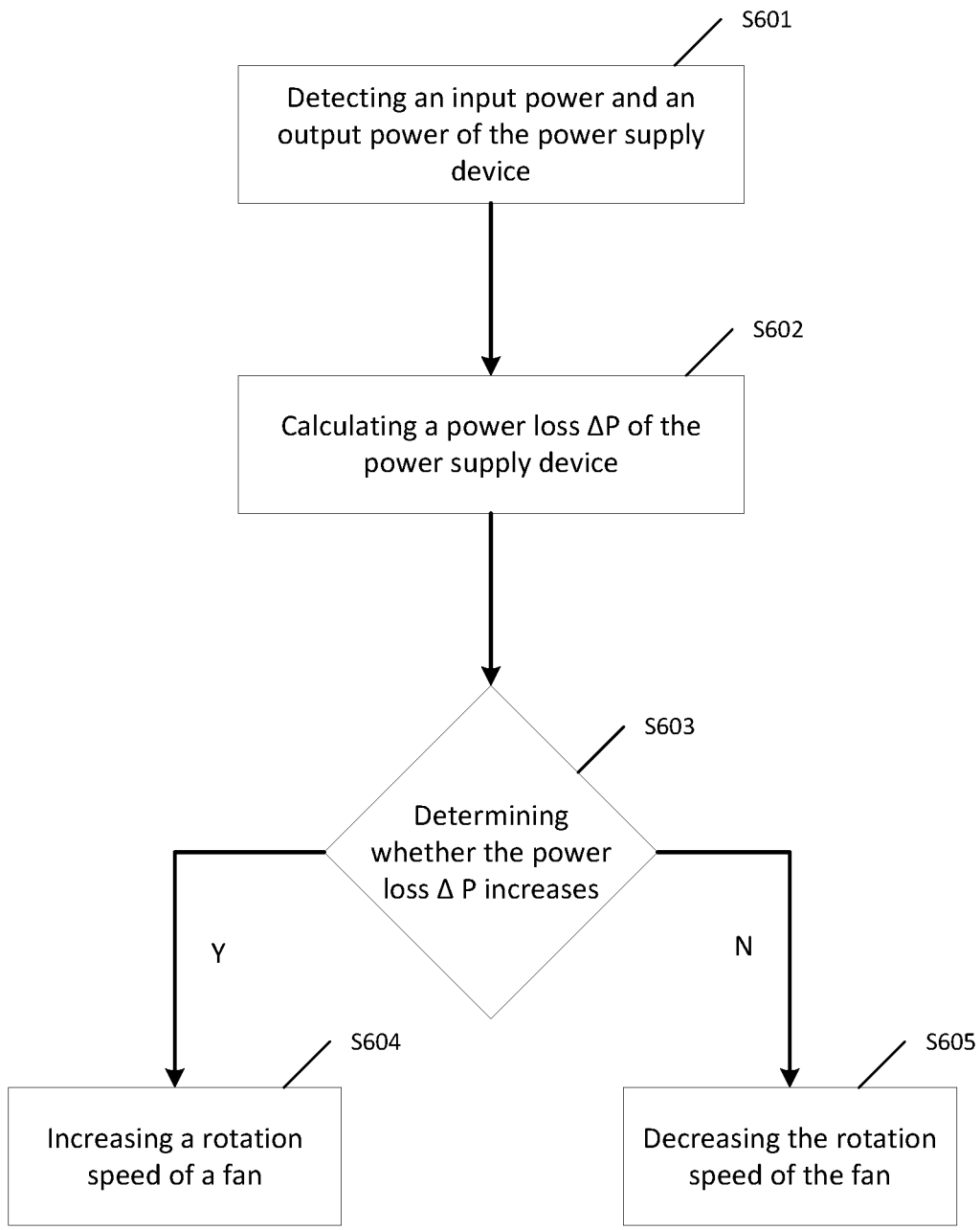
FIG. 16 is a flowchart of a method for fan speed adjustment of a power supply device according to an example.

Referring to FIG. 16, another method for adjusting the speed of the fan for the power supply device includes steps described below:

In S601, an input power Pi and an output power Po of the power supply device is detected.

In S602, a power loss ΔP of the power supply device is obtained according to the input power Pi and the output power Po of the power supply device, where:

$$\Delta P = Po - Pi.$$

In S603, whether the power loss ΔP increases is determined, and if the power loss ΔP increases, step S604 is performed; if the power loss ΔP does not increase, step S605 is performed.

In S604, the rotation speed of the fan is increased.

In S605, the rotation speed of the fan is decreased.

The above method can be executed by a software program written into the control module. The difference from the method shown in FIG. 14 is that the input power and output power of the power supply device are detected in step S801, and the specific implementation is not repeated here.

The basic principles, main features and advantages of the present disclosure have been shown and described above. Those skilled in the art should understand that the above examples do not limit the present disclosure in any form, and that any technical solution obtained by means of equivalent substitution or equivalent transformation falls within the protection scope of the present disclosure.

INDUSTRIAL APPLICABILITY

The present disclosure provides a portable electrical energy system and a measuring method for the portable electrical energy system, which can reduce the calculation error of remaining electric quantity and improve the utilization rate of the battery.

What is claimed is:

1. A measuring method for a portable electrical energy system, wherein the portable power system comprises a power supply device comprising a battery management system (BMS) control module, and a plurality of battery packs detachably connected to the power supply device for powering a hand-held power tool, the method comprising:
   acquiring, by the battery management system control module, a total capacity and an initial electric quantity percentage of each of the plurality of battery packs;
   detecting, by the battery management system control module, a discharging current and a discharging time of each of the plurality of battery packs;
   calculating, by the battery management system control module, a discharging capacity of each of the plurality of battery packs, wherein the discharging capacity of each of the plurality of battery packs is equal to an integral of the discharging current and the discharging time of each of the plurality of battery packs;
   calculating, by the battery management system control module, an initial remaining electric quantity of each of the plurality of battery packs, wherein the initial remaining electric quantity of each of the plurality of battery packs is equal to a product of the total capacity of each of the plurality of battery packs and the initial electric quantity percentage minus the discharging capacity;
   calculating, by the battery management system control module, a real-time electric quantity percentage of each of the plurality of battery packs, wherein the real-time electric quantity percentage is equal to the initial remaining electric quantity of each of the plurality of battery packs divided by the total capacity of each of the plurality of battery packs;
   acquiring, by the battery management system control module, an open circuit voltage of each of the plurality of battery packs and a real-time internal resistance of a cell unit of each of the plurality of battery packs;
   calculating, by the battery management system control module, a remaining electric quantity of each of the plurality of battery packs, wherein the remaining electric quantity is equal to a ratio of a difference between the open circuit voltage and a discharge cut-off voltage of each of the plurality of battery packs to the real-time internal resistance of the cell unit; and
   calculating, by the battery management system control module, a remaining electric quantity of the portable electrical energy system, wherein the remaining electric quantity of the portable electrical energy system is equal to a sum of remaining electric quantities of battery packs accessed to the power supply device.

2. The measuring method according to claim 1, wherein the open circuit voltage of each of the plurality of battery packs is calculated according to an electric quantity percentage curve of each of the plurality of battery packs.

3. The measuring method according to claim 1, wherein the real-time internal resistance of the cell unit is calculated according to a cell internal resistance table of each of the plurality of battery packs.

4. The measuring method according to claim 1, further comprising reading an identity (ID) information of the each accessed battery pack, determining whether the ID information of each of the plurality of battery packs is stored in the power supply device, and, in response to determining that the ID information of each of the plurality of battery packs is stored in the power supply device, reading the total capacity of each of the plurality of battery packs.

5. The measuring method according to claim 1, further comprising calculating, by the battery management system control module, a remaining discharge time of the portable electrical energy system, wherein the remaining discharge time of the portable electrical energy system is equal to the remaining electric quantity of the portable electrical energy system divided by a discharging current of the portable electrical energy system and the discharging current of the portable electrical energy system is equal to a sum of discharging currents of the battery packs.

6. The measuring method according to claim 1, further comprising determining, by the battery management system control module, whether the each accessed of the plurality of battery packs is in a charging state, in response to determining that each of the plurality of battery packs is in the charging state, reading a lowest single cell voltage of each of the plurality of battery packs, and calibrating the initial electric quantity percentage of each of the plurality of battery packs according to the lowest single cell voltage of each of the plurality of battery packs.

7. The measuring method according to claim 6, wherein the initial electric quantity percentage of each of the plurality of battery packs is calibrated according to the lowest single cell voltage and an electric quantity percentage curve of each of the plurality of battery packs.

8. A portable electrical energy system, comprising:
a plurality of battery packs, which are at least capable of supplying power to a hand-held power tool; and
a power supply device, which is configured for outputting electrical energy from the plurality of battery packs or inputting electrical energy to the plurality of battery packs;
wherein the power supply device comprises:
a battery pack interface, which is configured for accessing each of the plurality of battery packs; and
a battery management system (BMS) control module configured to:
acquire a total capacity and an initial electric quantity percentage of each of the plurality of battery packs;
detect a discharging current and a discharging time of each of the plurality of battery packs;
calculate a discharging capacity of each of the plurality of battery packs, wherein the discharging capacity of each of the plurality of battery packs is equal to an integral of the discharging current and the discharging time of each of the plurality of battery packs;
calculate an initial remaining electric quantity of each of the plurality of battery packs, wherein the remaining electric quantity of each of the plurality of battery packs is equal to a product of the total capacity of each of the plurality of battery packs and the initial electric quantity percentage minus the discharging capacity;
calculate a real-time electric quantity percentage of each of the plurality of battery packs, wherein the real-time electric quantity percentage is equal to the remaining electric quantity of each of the plurality of battery packs divided by the total capacity of each of the plurality of battery packs;
acquire an open circuit voltage of each of the plurality of battery packs and a real-time internal resistance of a cell unit of each of the plurality of battery packs;
calculate a remaining electric quantity of each of the plurality of battery packs, and the remaining electric quantity is equal to a ratio of a difference between the open circuit voltage and a discharge cut-off voltage of each of the plurality of battery packs to the real-time internal resistance of the cell unit; and
calculate a remaining electric quantity of the portable electrical energy system, wherein the remaining electric quantity of the portable electrical energy system is equal to a sum of remaining electric quantities of battery packs accessed to the power supply device.

9. The portable electrical energy system according to claim 8, wherein the BMS control module is configured to calculate the open circuit voltage of each of the plurality of battery packs according to an electric quantity percentage curve of each of the plurality of battery packs.

10. The portable electrical energy system according to claim 8, wherein the BMS control module is configured to calculate the real-time internal resistance of the cell unit according to a cell internal resistance table of each of the plurality of battery packs.

11. A measuring method for acquiring a remaining electric quantity of a battery pack for powering a hand-held power tool through a power supply device comprising a battery management system (BMS) control module, the power supply connectable with the battery pack, the method comprising:
acquiring, by the battery management system control module, a total capacity and an initial electric quantity percentage of the battery pack;
detecting, by the battery management system control module, a discharging current and a discharging time of the battery pack;
calculating, by the battery management system control module, a discharging capacity of the battery pack, wherein the discharging capacity of the battery pack is equal to an integral of the discharging current and the discharging time of the battery pack;
calculating, by the battery management system control module, an initial remaining electric quantity of the battery pack, wherein the initial remaining electric quantity of the battery pack is equal to a product of the total capacity of the battery pack and the initial electric quantity percentage minus the discharging capacity;
calculating, by the battery management system control module, a real-time electric quantity percentage of the battery pack, wherein the real-time electric quantity percentage is equal to a remaining electric quantity of the battery pack divided by the total capacity of the battery pack;
acquiring, by the battery management system control module, an open circuit voltage of the battery pack and a real-time internal resistance of a cell unit of the battery pack; and
calculating, by the battery management system control module, a remaining electric quantity of the battery pack, wherein the remaining electric quantity is equal to a ratio of a difference between the open circuit voltage and a discharge cut-off voltage of the battery pack to the real-time internal resistance of the cell unit.

12. The measuring method according to claim 11, wherein the open circuit voltage of the battery pack is calculated according to an electric quantity percentage curve of the battery pack.

* * * * *